(12) United States Patent
Lin et al.

(10) Patent No.: US 11,616,137 B2
(45) Date of Patent: Mar. 28, 2023

(54) SCHOTTKY POWER MOSFET

(71) Applicant: Texas Instruments Incorporated, Dallas, TX (US)

(72) Inventors: Haian Lin, Bethlehem, PA (US); Shuming Xu, Schnecksville, PA (US); Jacek Korec, Sunrise, FL (US)

(73) Assignee: Texas Instruments Incorporated, Dallas, TX (US)

( * ) Notice: Subject to any disclaimer, the term of this patent is extended or adjusted under 35 U.S.C. 154(b) by 196 days.

(21) Appl. No.: 16/821,165

(22) Filed: Mar. 17, 2020

(65) Prior Publication Data

US 2020/0220007 A1    Jul. 9, 2020

Related U.S. Application Data

(62) Division of application No. 14/135,661, filed on Dec. 20, 2013, now Pat. No. 10,629,723.

(60) Provisional application No. 61/746,802, filed on Dec. 28, 2012.

(51) Int. Cl.
| | |
|---|---|
| *H01L 29/08* | (2006.01) |
| *H01L 29/78* | (2006.01) |
| *H01L 29/66* | (2006.01) |
| *H01L 29/47* | (2006.01) |
| *H01L 29/872* | (2006.01) |
| *H01L 29/417* | (2006.01) |
| *H01L 29/10* | (2006.01) |

(52) U.S. Cl.
CPC ...... *H01L 29/7806* (2013.01); *H01L 29/0878* (2013.01); *H01L 29/47* (2013.01); *H01L 29/66143* (2013.01); *H01L 29/66712* (2013.01); *H01L 29/872* (2013.01); *H01L 29/1095* (2013.01); *H01L 29/41766* (2013.01)

(58) Field of Classification Search
CPC . H01L 29/7806; H01L 29/0878; H01L 29/47; H01L 29/66143; H01L 29/66712
See application file for complete search history.

(56) References Cited

U.S. PATENT DOCUMENTS

| | | |
|---|---|---|
| 2005/0082640 A1 | 4/2005 | Takei et al. |
| 2009/0179264 A1 | 7/2009 | Korec et al. |
| 2011/0073906 A1 | 3/2011 | Bobde et al. |
| 2011/0136310 A1 | 6/2011 | Grivna |
| 2011/0156682 A1 | 6/2011 | Girdhar et al. |

*Primary Examiner* — Samuel A Gebremariam

(74) *Attorney, Agent, or Firm* — Yudong Kim; Frank D. Cimino

(57) ABSTRACT

A semiconductor device containing a vertical power MOSFET with a planar gate and an integrated Schottky diode is formed by forming a source electrode on an extended drain of the vertical power MOSFET to form the Schottky diode and forming the source electrode on a source region of the vertical power MOSFET. The Schottky diode is connected through the source electrode to the source region. A drain electrode is formed at a bottom of a substrate of the semiconductor device. The Schottky diode is connected through the extended drain of the vertical power MOSFET to the drain electrode.

20 Claims, 16 Drawing Sheets

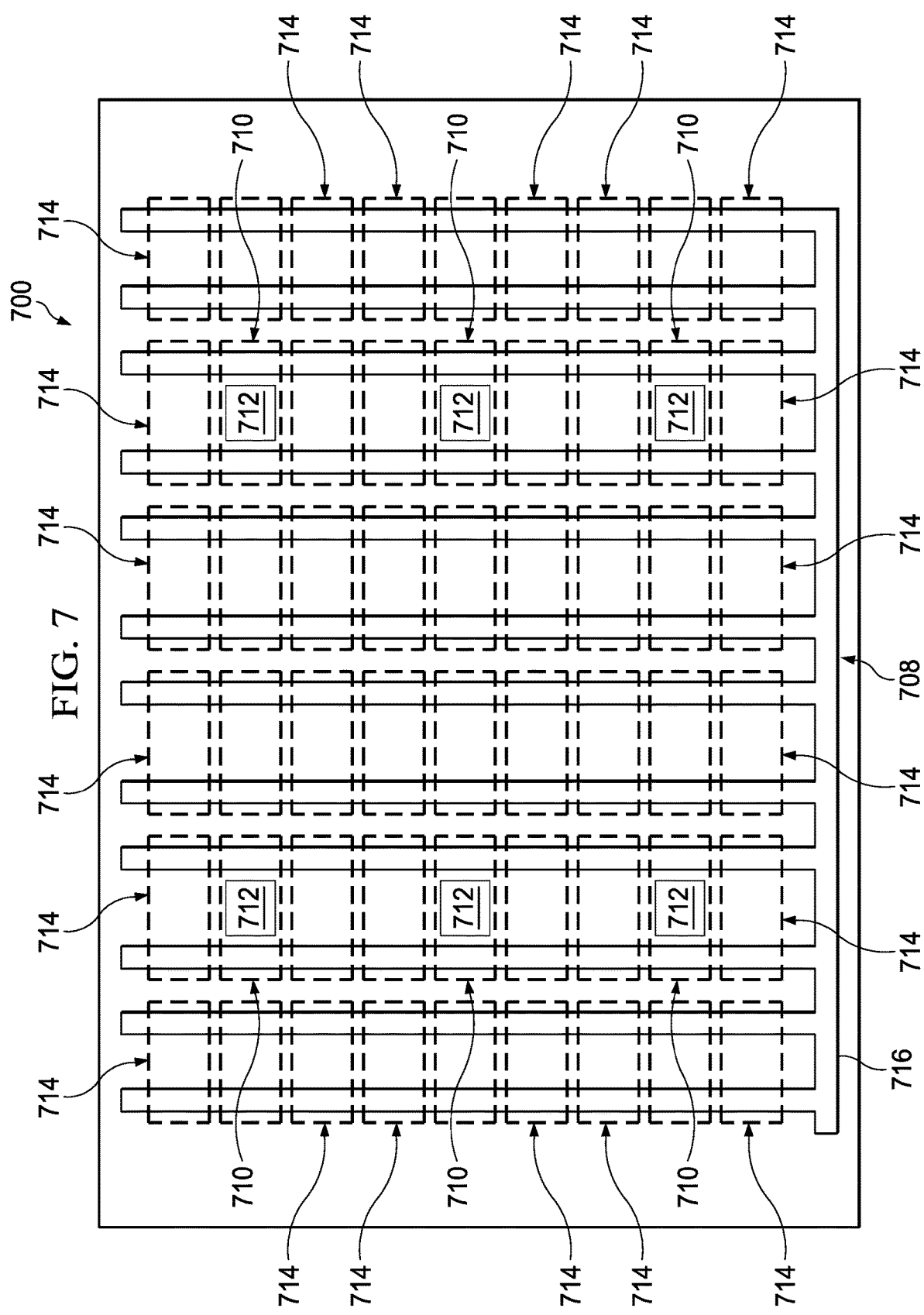

SCHOTTKY POWER MOSFET

CROSS-REFERENCE TO RELATED APPLICATIONS

This application is a divisional of U.S. Nonprovisional patent application Ser. No. 14/135,661, filed Dec. 20, 2013, which claims the benefit of U.S. Provisional Application Ser. No. 61/746,802, filed Dec. 28, 2012, the contents of both of which are herein incorporated by reference in its entirety.

FIELD OF THE INVENTION

This invention relates to the field of semiconductor devices. More particularly, this invention relates to power transistors in semiconductor devices.

BACKGROUND OF THE INVENTION

A power metal oxide semiconductor field effect transistor (MOSFET) may be operated a high frequency to provide efficient power regulation, for example in a switching power supply. During operation of the power MOSFET, the body diode of the MOSFET, that is, the diode formed by the drain and the body of the MOSFET, is alternately biased between conduction and blocking states. During the conduction state, charge is stored in lightly doped regions located adjacent to the PN junction of the body diode. Before returning to the body diode's blocking state, the charge must be extracted and neutralized. This process is referred to as reverse recovery. Reducing the reverse recovery time improves high frequency operation. One technique to improve the reverse recovery time is to provide a Schottky diode between the source and drain of the power MOSFET. However, adding a discrete Schottky diode to the power MOSFET may undesirably increase a chip count and a total cost of the system. Integrating a Schottky diode with the power MOSFET and attaining desired values of performance and cost has been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device containing a vertical power MOSFET with a planar gate and an integrated Schottky diode is formed by forming a source electrode so as to contact an extended drain of the vertical power MOSFET to form the Schottky diode. The source electrode is also formed on a source region of the vertical power MOSFET. The source electrode is thus connected to both the Schottky diode and the source region. A drain electrode is formed at a bottom of a substrate of the semiconductor device. The Schottky diode is connected through the extended drain of the vertical power MOSFET to the drain electrode.

DESCRIPTION OF THE VIEWS OF THE DRAWING

FIG. 7 is a top view of an example semiconductor device containing a vertical power MOSFET and an integrated Schottky diode.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device containing a vertical power MOSFET with a planar gate and an integrated Schottky diode is formed by forming a source electrode so as to contact a lightly doped extended drain of the vertical power MOSFET to form the Schottky diode. The planar gate is disposed over a top, horizontal, surface of the substrate. The lightly doped extended drain includes a drift region, and may optionally include a drain extension above the drift region. The Schottky diode may be formed on the drift region, or on the drain extension. The source electrode connects to the Schottky diode and to a source region of the vertical power MOSFET. A drain electrode is formed at a bottom of a substrate of the semiconductor device. The Schottky diode is connected through the extended drain to the drain electrode.

The vertical power MOSFET may include one or more cells containing the Schottky diode and may optionally include one or more cells without a Schottky diode. The vertical power MOSFET may be an n-channel MOSFET or a p-channel MOSFET.

Figure 1:
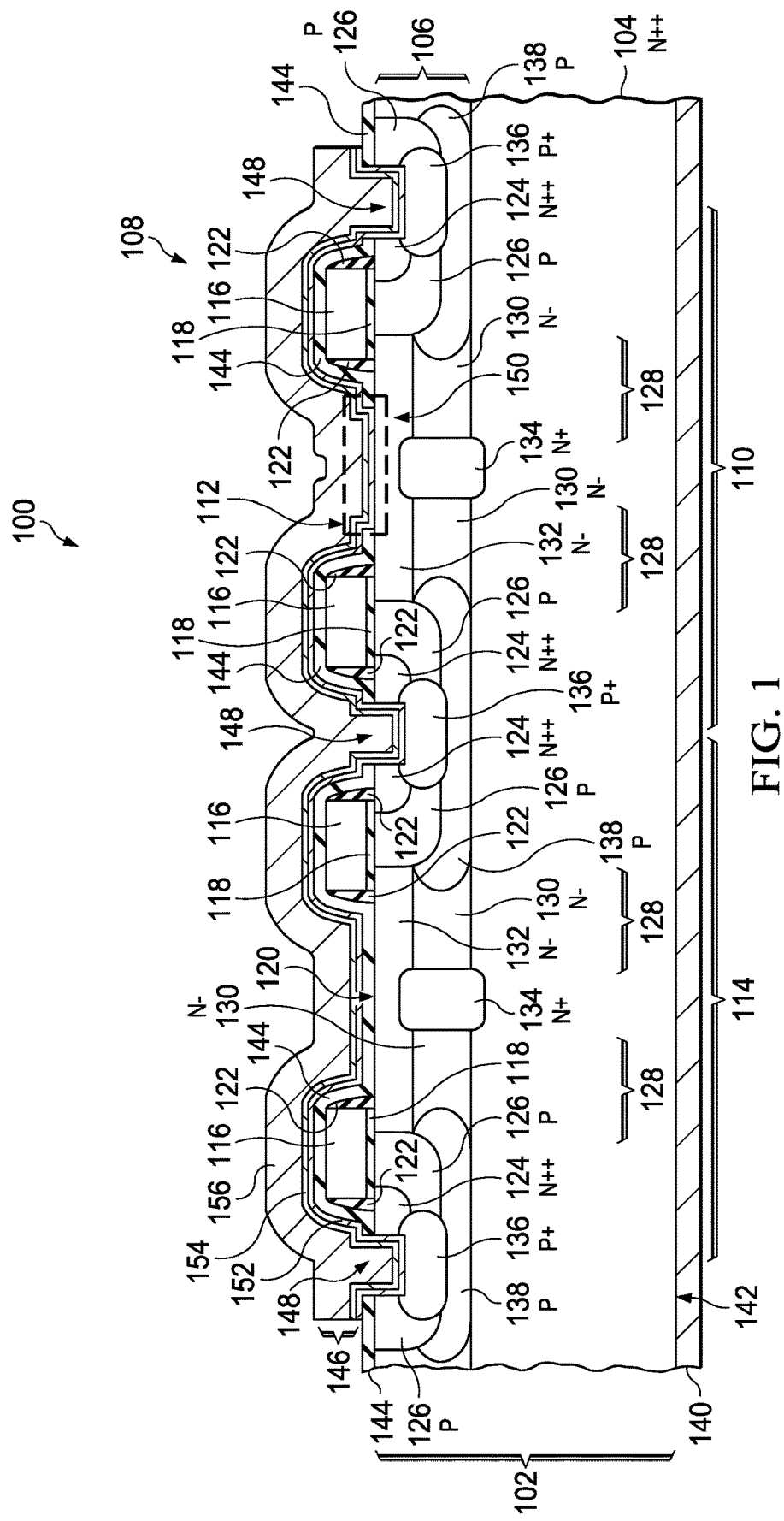
FIG. 1 is a cross section of an example semiconductor device containing an n-channel vertical power MOSFET and an integrated Schottky diode.

FIG. 1 is a cross section of an example semiconductor device containing an n-channel vertical power MOSFET and an integrated Schottky diode. The semiconductor device 100 is formed on a substrate 102 which includes an n-type heavily doped base 104 of single crystal silicon and an n-type lightly doped epitaxial layer 106 of silicon formed over the heavily doped base 104. The heavily doped base 104 has a bulk resistivity less than 0.1 ohm-cm, and possibly 0.0005 ohm-cm to 0.01 ohm-cm. The vertical power MOS- FET 108 includes a first MOSFET cell 110 which includes the Schottky diode 112 and may optionally include a second MOSFET cell 114 which is free of a Schottky diode. Increasing the instances of the second MOSFET cell 114 may desirably increase the current capacity and increasing the instances of the first MOSFET cell 110 may increase the current capacity and increase the maximum operating frequency. The vertical power MOSFET 108 may include as many instances of the first MOSFET cell 110 and as many instances of the second MOSFET cell 114 as needed to advantageously attain a desired current capacity and a desired maximum operating frequency. Additional instances of the second MOSFET cell 114 may provide more increased current capacity than additional instances of the first MOSFET cell 110, so that minimizing an area of the vertical power MOSFET 108 may entail a mix of instances of the first MOSFET cell 110 and instances of the second MOSFET cell 114.

The first MOSFET cell 110 and the second MOSFET cell 114 each include portions of a planar gate 116 of the vertical power MOSFET 108 formed on a gate dielectric layer 118 at a top surface 120 of the substrate 102. The planar gate 116 may include a layer of polycrystalline silicon, referred to as polysilicon, on the gate dielectric layer 118 and possibly a layer of metal silicide such as tungsten silicide on the polysilicon. Spacers 122 may be formed on lateral surfaces of the planar gate 116. The first MOSFET cell 110 and the second MOSFET cell 114 also include portions of an n-type source region 124 in the substrate 102 adjacent to the planar gate 116, and portions of a p-type body region 126 under the planar gate 116 and abutting the source region 124. The first MOSFET cell 110 and the second MOSFET cell 114 also include portions of an n-type lightly doped extended drain 128. The lightly doped extended drain 128 includes an n-type lightly doped drift region 130 over the heavily doped base 104, and an n-type lightly doped drain extension 132 over the lightly doped drift region 130, abutting the body region 126 under the planar gate 116. The first MOSFET cell 110 and the second MOSFET cell 114 further include n-type heavily doped sinkers 134 in the lightly doped drift region 130, which provide low impedance paths between the lightly doped drain extension 132 and the heavily doped base 104. An average doping density of the heavily doped sinkers 134 may be $10^{18}$ cm$^{-3}$ to $10^{20}$ cm$^{-3}$. Including a heavily doped sinker 134 in the first MOSFET cell 110 advantageously reduces a series resistance between the Schottky diode 112 and the drain electrode 140. P-type body contact regions 136 are disposed in the substrate 102 abutting the body region 126, and p-type deep wells 138 may be disposed under the body region 126 and the body contact regions 136.

A drain electrode 140 is disposed at a bottom surface 142 of the heavily doped base 104. A dielectric layer 144 is disposed over the planar gate 116 and the substrate 102. A source electrode 146 is disposed over the dielectric layer 144 and makes contact to the source region 124 and the body contact regions 136 in contact vias 148. The source electrode 146 also makes contact with the lightly doped drain extension 132 in the first MOSFET cell 110 through an opening 150 in the dielectric layer 144 to form the Schottky diode 112. Metal in the source electrode 146 provides an anode of the Schottky diode 112, and the lightly doped drain extension 132 in the first MOSFET cell 110 contacting the metal in the source electrode 146 provides a cathode of the Schottky diode 112. The Schottky diode 112 is connected to the drain electrode 140 through the heavily doped sinker 134 under the Schottky diode 112 and the heavily doped base 104. The source electrode 146 may include a refractory metal layer 152 such as molybdenum, palladium, titanium, platinum, cobalt, chromium or nickel, which makes contact with the lightly doped drain extension 132 at the Schottky diode 112. The source electrode 146 may optionally include a barrier layer 154 such as titanium nitride or tantalum nitride disposed on the refractory metal layer 152. The source electrode 146 includes a thick electrode layer 156, such as aluminum or copper, at least 1 micron thick, disposed over the refractory metal layer 152, on the barrier layer 154 if present.

Figure 2A:
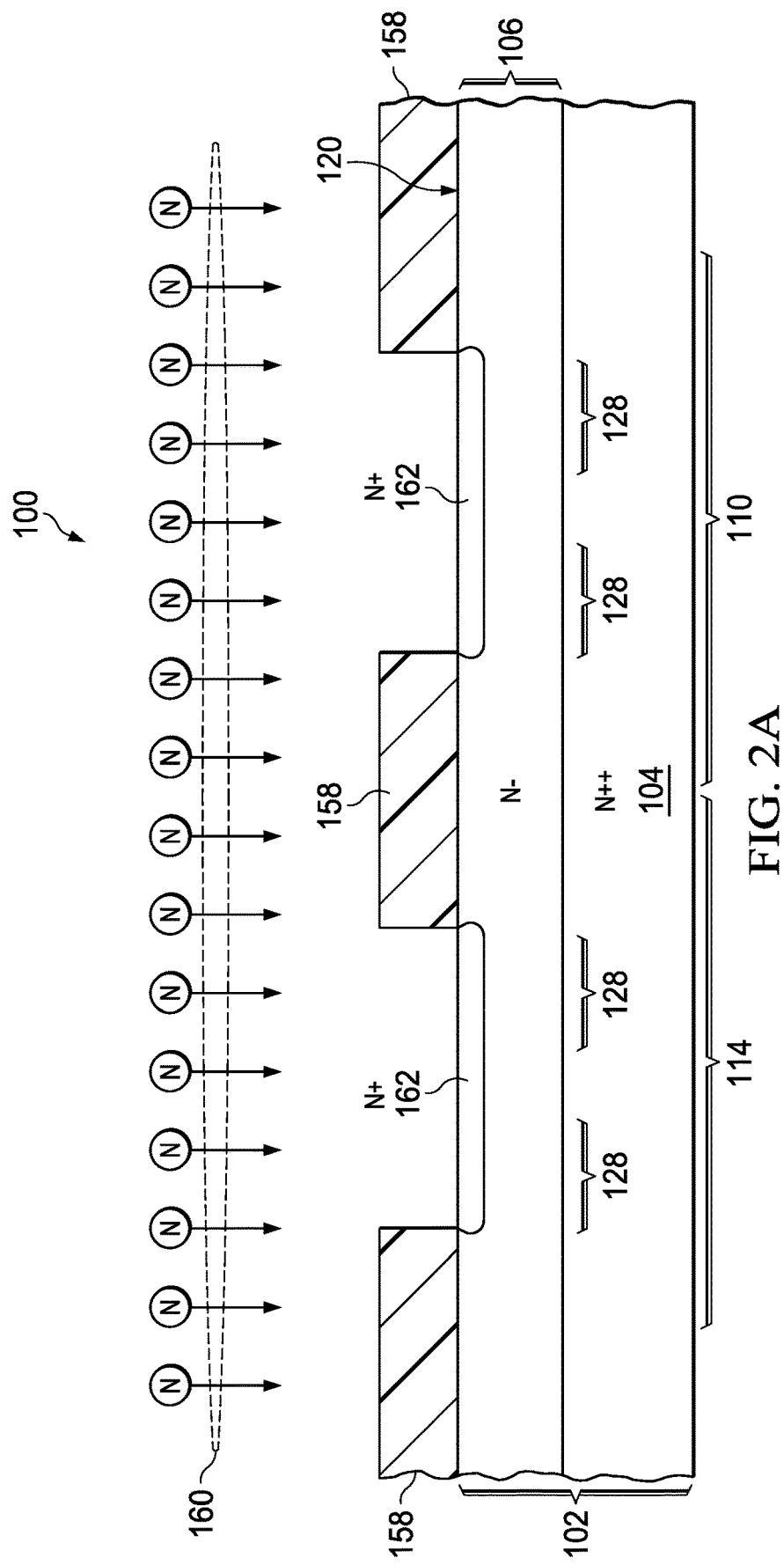
FIG. 2A through FIG. 2G are cross sections of the semiconductor device of FIG. 1, depicted at key stages of fabrication.

FIG. 2A through FIG. 2G are cross sections of the semiconductor device of FIG. 1, depicted at key stages of fabrication. Referring to FIG. 2A, the lightly doped epitaxial layer 106 is formed with an average doping density of $1 \times 10^{15}$ cm$^{-3}$ to $1 \times 10^{16}$ cm$^{-3}$ over the heavily doped base 104. An optional layer of silicon dioxide 5 nanometers to 20 nanometers thick, referred to as pad oxide, may be formed at a top surface of the lightly doped epitaxial layer 106 by thermal oxidation of the silicon in the lightly doped epitaxial layer 106. An implant mask 158 is formed over the lightly doped epitaxial layer 106 so as to expose areas for the lightly doped drain extension 132 of FIG. 1. N-type dopants 160 such as phosphorus and/or arsenic are implanted into the lightly doped epitaxial layer 106 in the areas exposed by the implant mask 158 to form drain extension implanted regions 162. The n-type dopants 160 may be implanted at a dose of $1 \times 10^{12}$ cm$^{-2}$ to $5 \times 10^{13}$ cm$^{-2}$. The implant mask 158 is removed after the drain extension implanted regions 162 are formed. A subsequent anneal diffuses and activates the implanted dopants 160 in the drain extension implanted regions 162 to form the lightly doped drain extension 132 of the lightly doped extended drain 128.

Figure 2B:
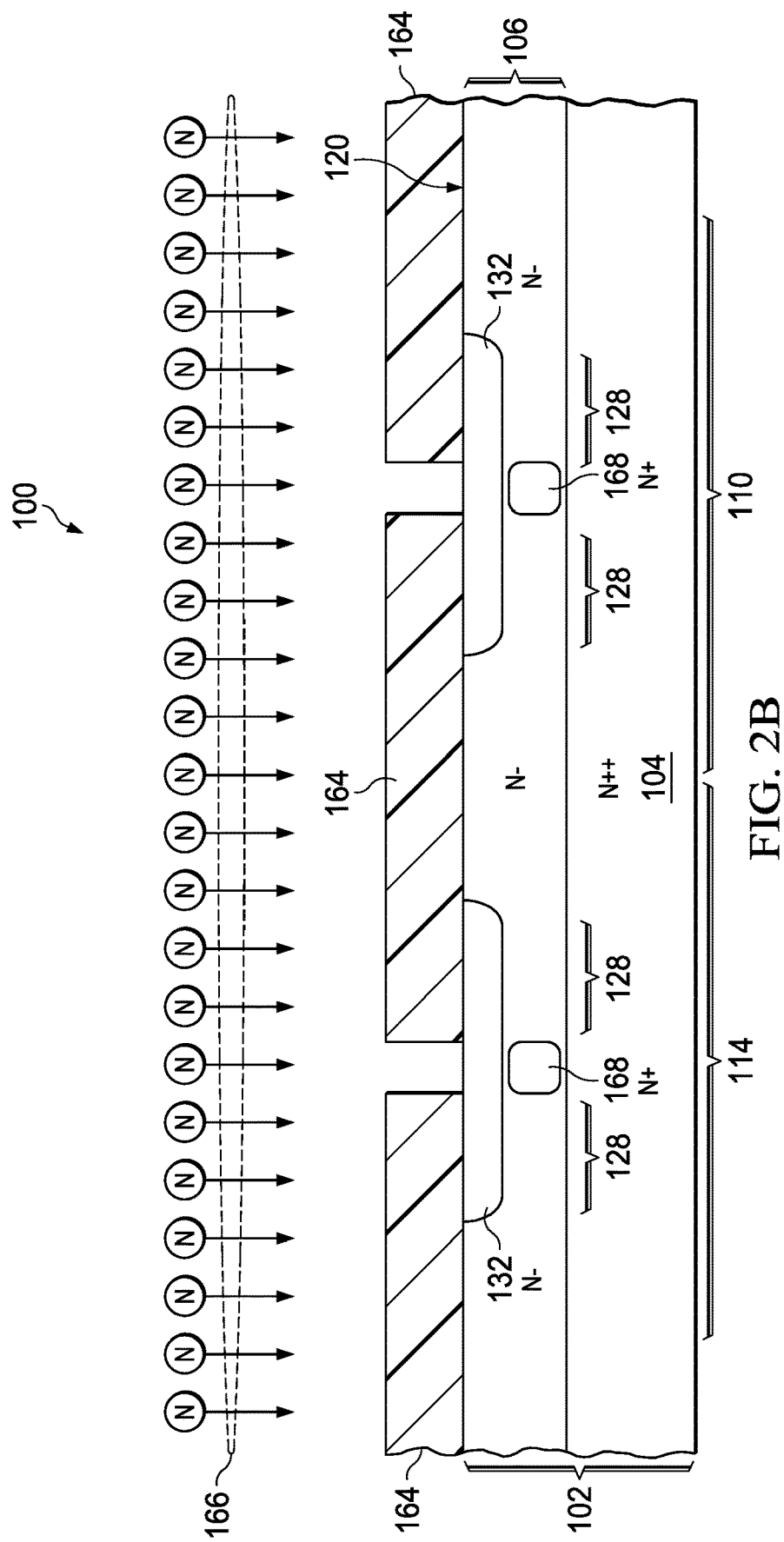

Referring to FIG. 2B, an implant mask 164 is formed over the lightly doped epitaxial layer 106 so as to expose areas for the heavily doped sinkers 134 of FIG. 1. N-type dopants 166 such as phosphorus and/or arsenic are implanted into the lightly doped epitaxial layer 106 in the areas exposed by the implant mask 164 to form sinker implanted regions 168. The n-type dopants 166 may be implanted at a total dose of $1 \times 10^{15}$ cm$^{-2}$ to $1 \times 10^{16}$ cm$^{-2}$, and possibly in two or more sub implants with energies of 300 keV to 1200 keV, to place the majority of the implanted dopants 166 below the lightly doped drain extension 132. The implant mask 164 is removed after the sinker implanted regions 168 are formed. A subsequent anneal diffuses and activates the implanted dopants 166 in the sinker implanted regions 168 to form the heavily doped sinkers 134.

Figure 2C:
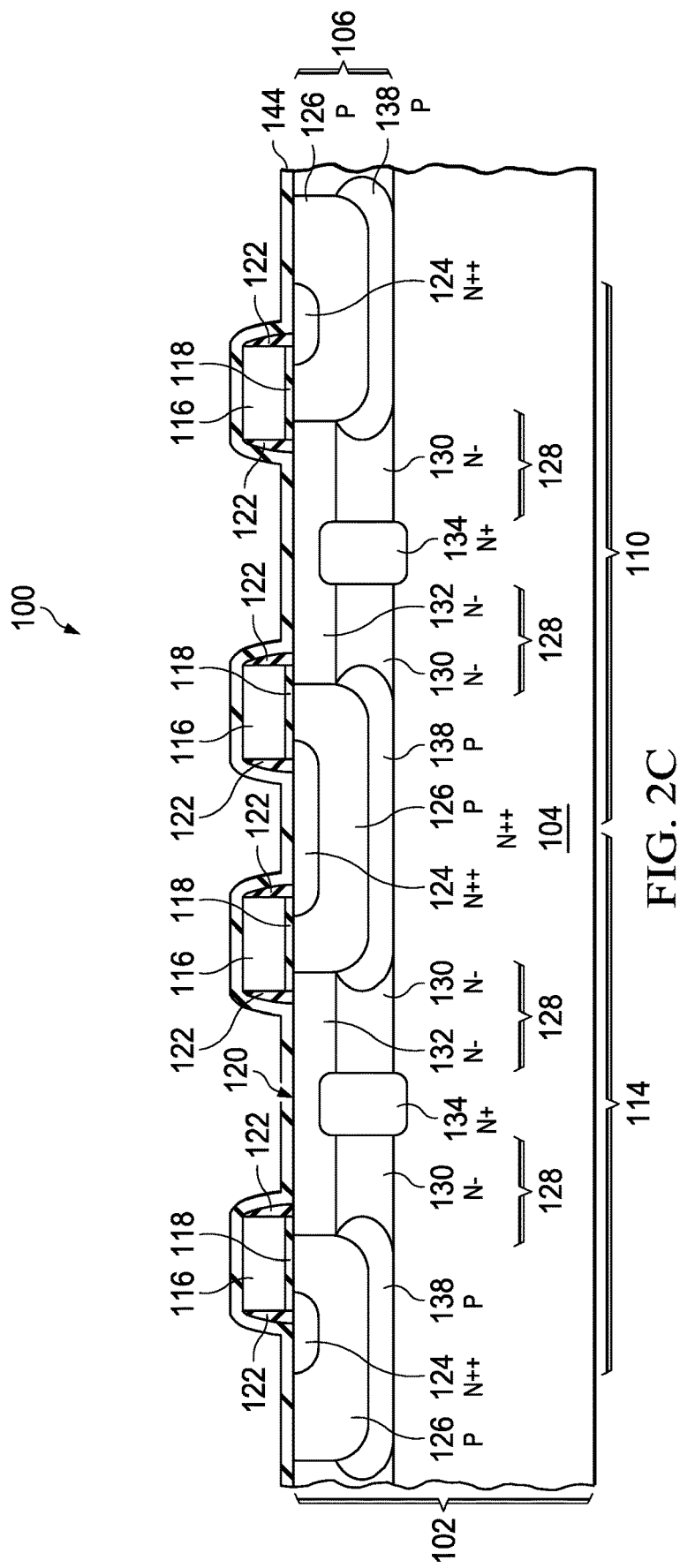

Referring to FIG. 2C, the gate dielectric layer 118 is formed at the top surface 120 of the substrate 102, for example by thermal oxidation of the silicon in the lightly doped epitaxial layer 106. The planar gate 116 is formed over the gate dielectric layer 118, for example by forming a layer of polysilicon over the gate dielectric layer 118 and a layer of tungsten silicide over the layer of polysilicon. A gate mask is formed over the layer of tungsten silicide so as to cover areas for the planar gate 116. Subsequently, a gate etch process removes tungsten silicide and polysilicon in areas exposed by the gate mask to leave the planar gate 116. The gate mask is subsequently removed. The spacers 122 are formed by forming a conformal layer of dielectric material such as silicon nitride and/or silicon dioxide over the planar gate 116 and top surface 120 of the substrate 102, and subsequently removing the dielectric material from a top of the planar gate 116 and the top surface 120 of the substrate 102 using an anisotropic etch process such as a reactive ion etch (RIE) process, leaving the spacers 122.

The body region 126 and the deep wells 138 are formed by forming an implant mask over an existing top surface of the semiconductor device 100 so as to expose areas for the body region 126. P-type dopants for the body region 126, such as boron, are implanted into the lightly doped epitaxial layer 106 in areas exposed by the implant mask at an energy sufficient to place a majority of the implanted dopants at a depth of 100 nanometers to 300 nanometers, for example 30 keV to 100 keV. The p-type dopants for the body region 126 may be implanted at a dose of, for example, $1 \times 10^{12}$ cm$^{-2}$ to $1 \times 10^{14}$ cm$^{-2}$. P-type dopants for the deep wells 138, such as boron, are implanted into the lightly doped epitaxial layer 106 in areas exposed by the implant mask at an energy sufficient to place a majority of the implanted dopants at a depth below the body region 126, for example, 200 keV to 500 keV. The implant mask is removed and the substrate 102 is subsequently annealed to diffuse and activate the implanted dopants to form the body region 126 and the deep wells 138. Portions of the lightly doped epitaxial layer 106 between the deep wells 138 and under the lightly doped drain extension 132 form the lightly doped drift region 130.

The source region 124 is formed by forming an implant mask over an existing top surface of the semiconductor device 100 so as to expose areas for the source region 124. N-type dopants such as phosphorus and arsenic are implanted into the lightly doped epitaxial layer 106 in the areas exposed by the implant mask. The areas exposed by the implant mask may overlap the planar gate 116 so that an edge of the planar gate 116 defines a boundary of the implanted dopants. The implant mask is removed and the substrate 102 is subsequently annealed to diffuse and activate the implanted dopants to form the source region 124.

The dielectric layer 144 is formed over the planar gate 116, the spacers 122 and the top surface 120 of the substrate 102. The dielectric layer 144 may include one or more layers of silicon dioxide and/or silicon nitride, and be formed by a plasma enhanced chemical vapor deposition (PECVD) process using tetraethyl orthosilicate, also known as tetraethoxysilane or TEOS, to form silicon dioxide, and/or bis (tertiary-butylamino) silane, also known as BTBAS, to form silicon nitride.

Figure 2D:
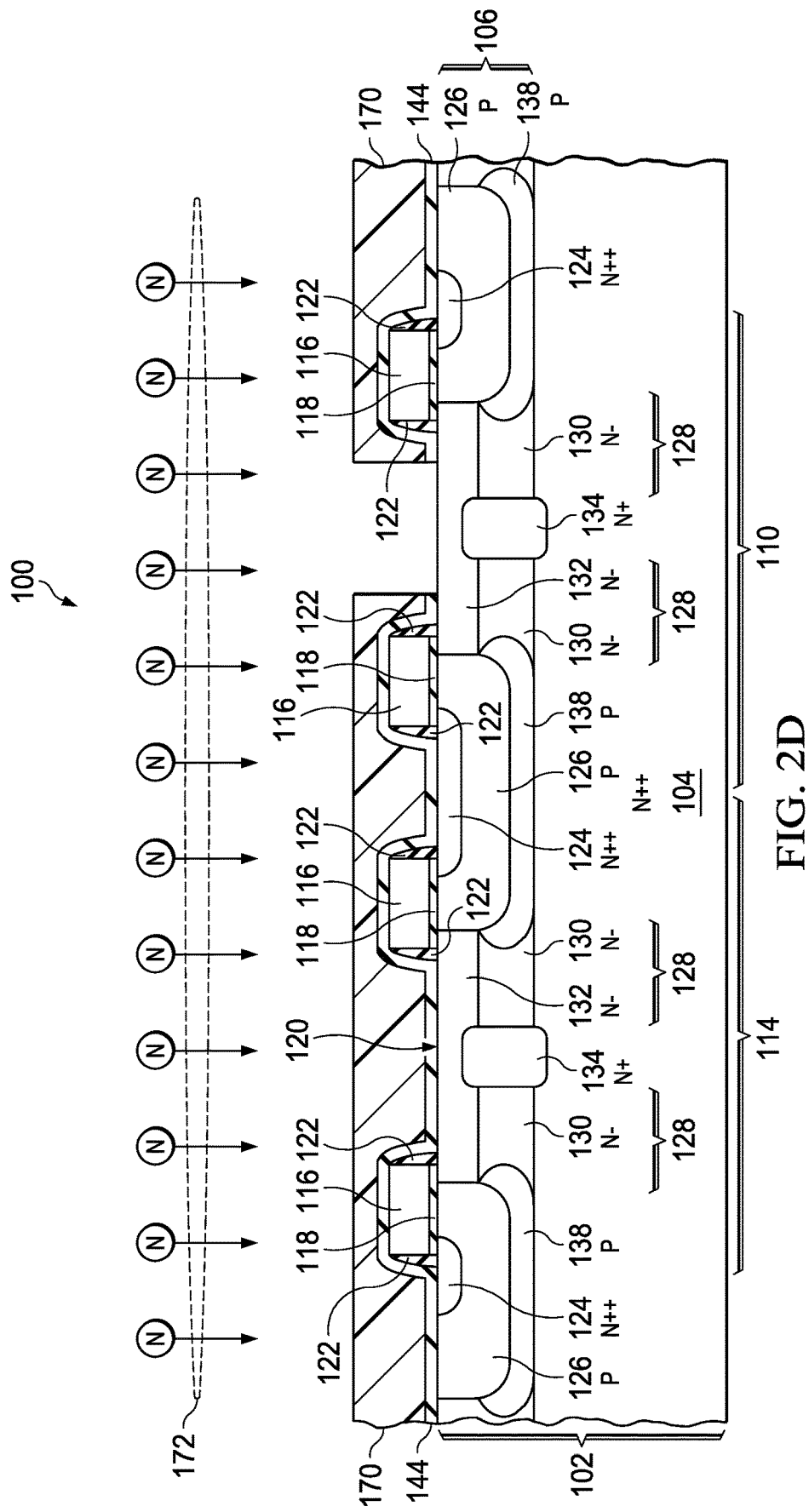

Referring to FIG. 2D, a Schottky mask 170 is formed over the dielectric layer 144 so as to expose an area for the Schottky diode 112 of FIG. 1. Dielectric material from the dielectric layer 144 is removed from the area exposed by the Schottky mask 170 so as to expose the top surface 120 of the substrate 102. The dielectric material may be removed, for example using a wet etch process including an aqueous solution of dilute buffered hydrofluoric acid.

N-type dopants 172 may optionally be implanted in the area for the Schottky diode 112 while the Schottky mask 170 is in place, to increase a doping density in the lightly doped drain extension 132 in the first MOSFET cell 110 to provide a desired Schottky diode barrier height. The n-type dopants 172 may be implanted at a dose of, for example, $1 \times 10^{11}$ cm$^{-2}$ to $1 \times 10^{13}$ cm$^{-2}$.

Figure 2E:
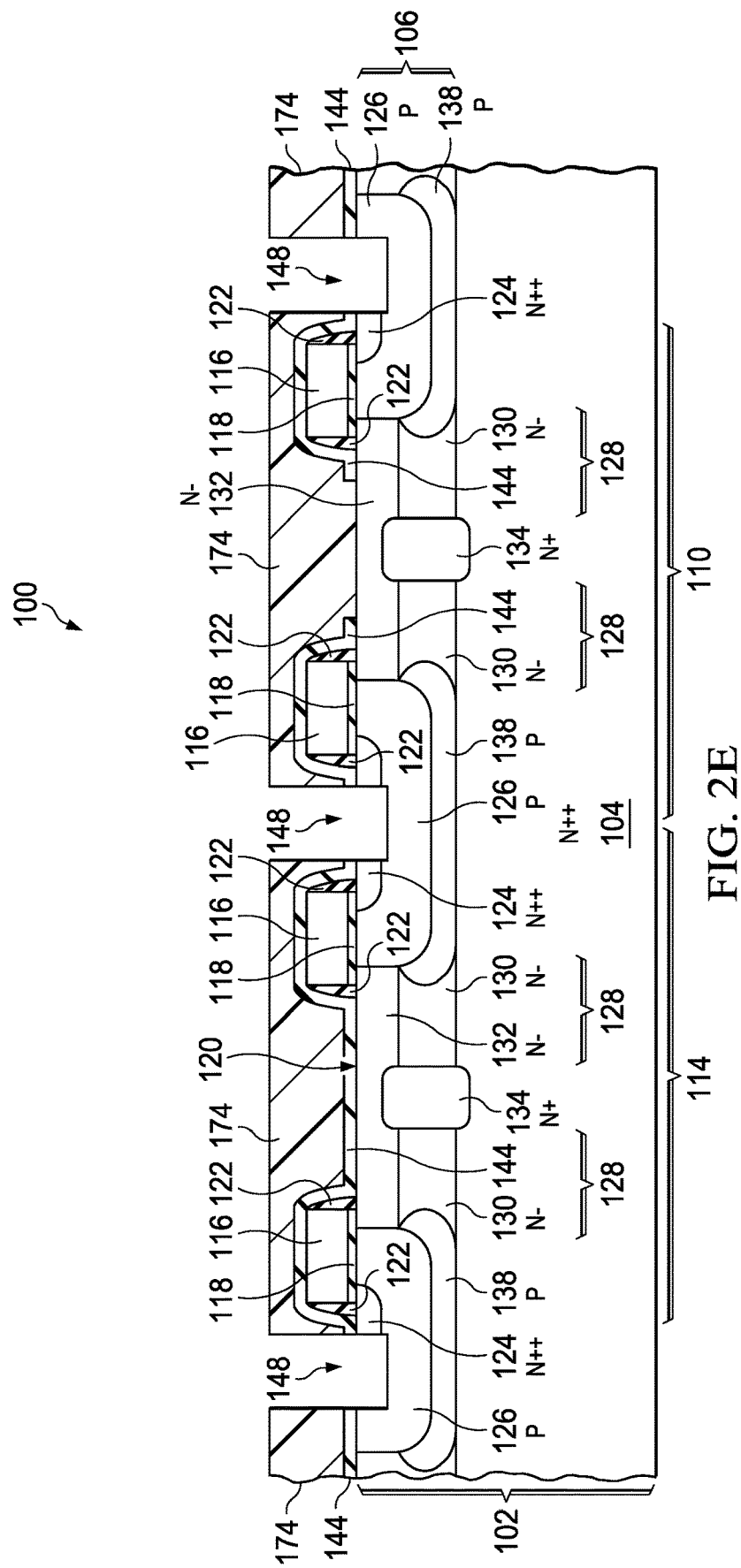

Referring to FIG. 2E, a contact mask 174 is formed over an existing top surface of the semiconductor device 100 so as to expose areas for the contact vias 148. Dielectric material is removed from the dielectric layer 144 and semiconductor material is removed from the lightly doped epitaxial layer 106 in areas exposed by the contact mask 174, through the source region 124 and into the body region 126, to form the contact vias 148.

Figure 2F:
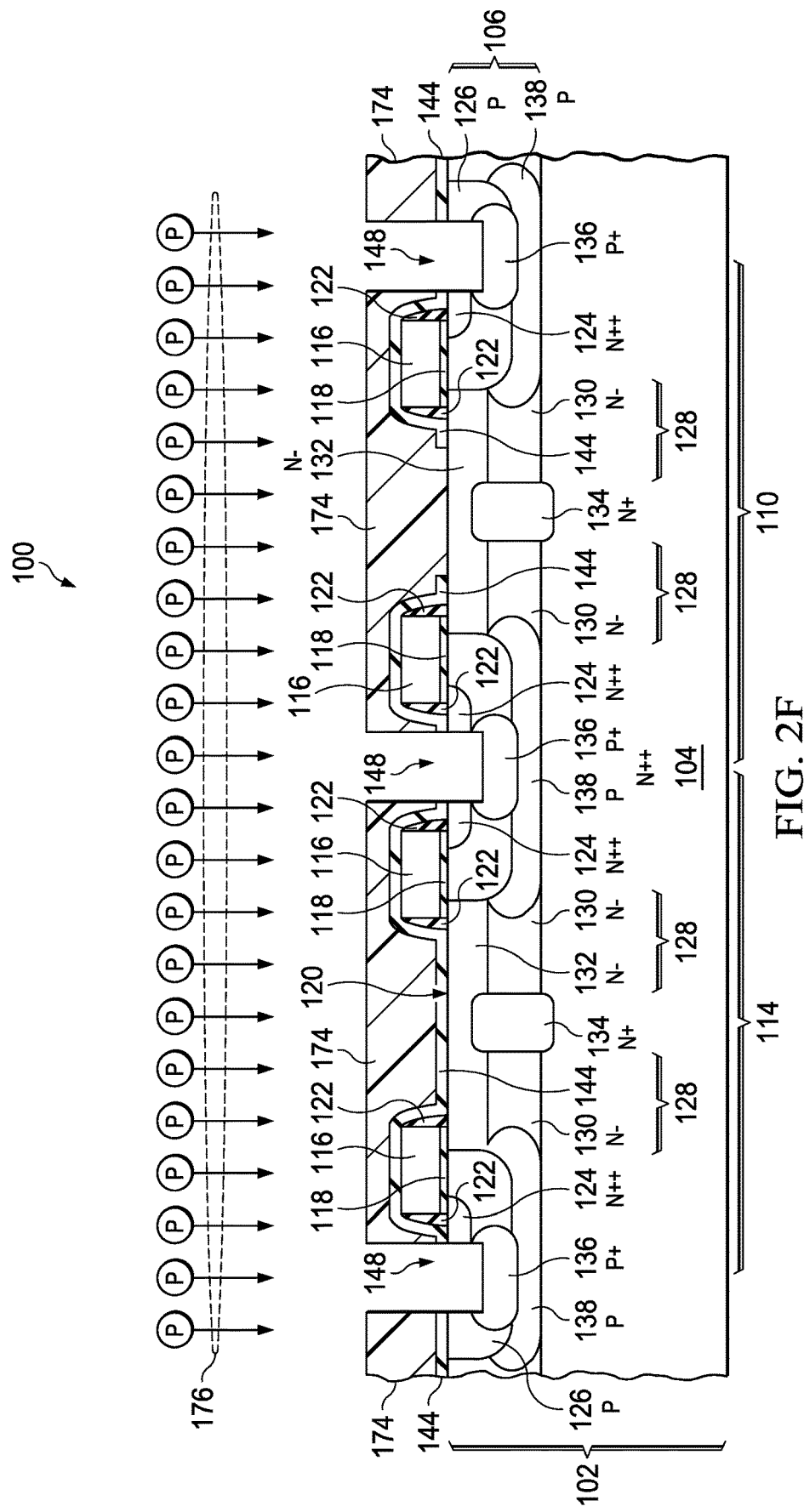

Referring to FIG. 2F, while the contact mask 174 is in place, p-type dopants 176 such as boron are implanted into the body region 126 in the contact vias 148. The contact mask 174 is subsequently removed and the substrate 102 is annealed to diffuse and activate the implanted p-type dopants to form the body contact regions 136.

Figure 2G:
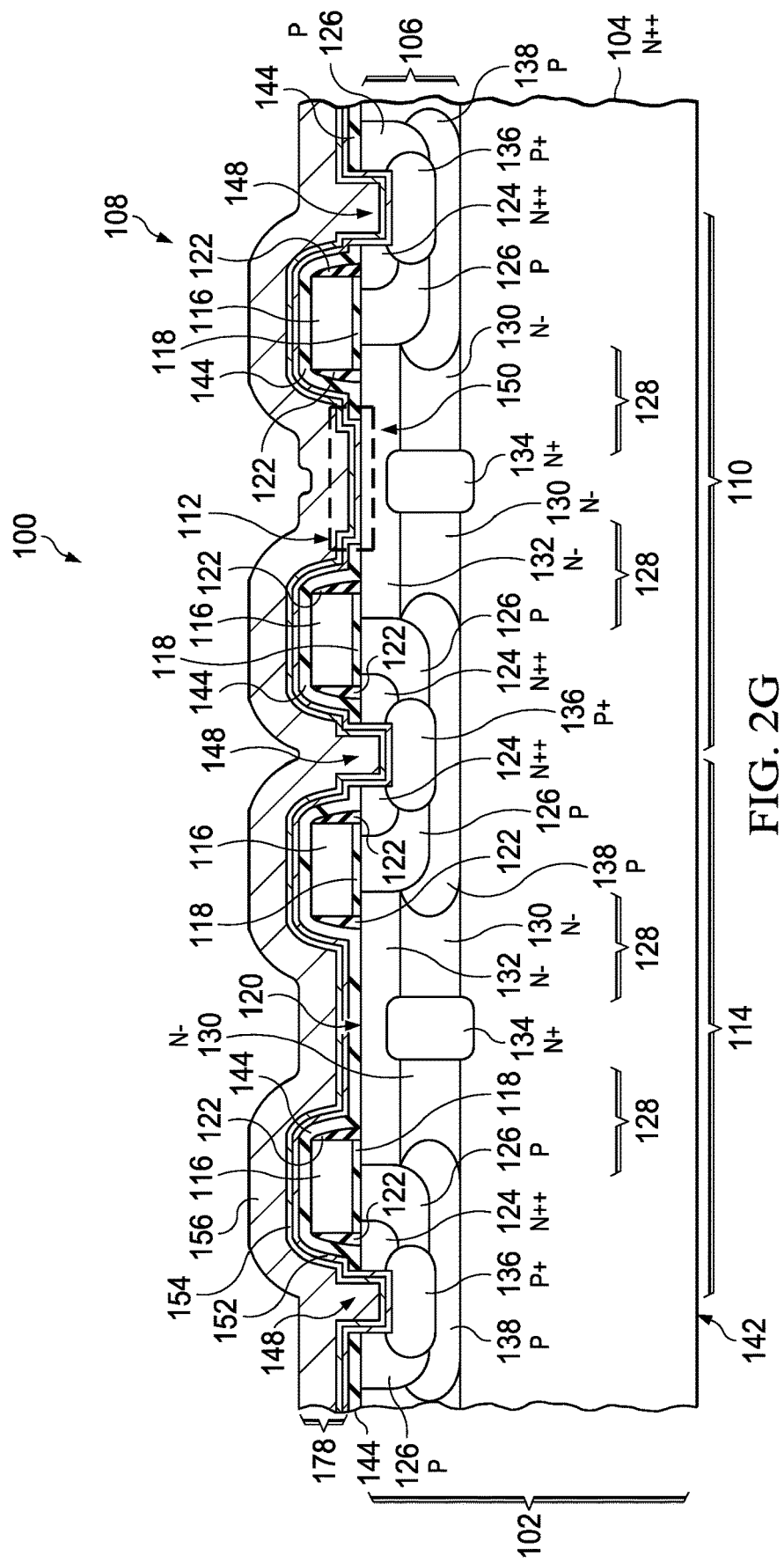

Referring to FIG. 2G, a layer of source metal 178 is formed on an existing top surface of the semiconductor device 100, including the refractory metal layer 152, the barrier layer 154, and the thick electrode layer 156. The refractory metal layer 152 may be, for example, 5 nanometers to 100 nanometers of molybdenum, palladium, titanium, platinum, cobalt, chromium or nickel, formed by a sputter process. The barrier layer 154 may be, for example, 10 nanometers to 100 nanometers of titanium nitride or tantalum nitride, formed by an atomic layer deposition (ALD) process or a chemical vapor deposition (CVD) process. The thick electrode layer 156 may include at least 1 micron of aluminum formed by a sputter process or at least 1 micron of copper formed by an electroplate process. The semiconductor device 100 may be annealed before the thick electrode layer 156 is formed so as to react the refractory metal layer 152 with the lightly doped epitaxial layer 106 in the Schottky diode 112 to provide desired values of barrier height and leakage current. The anneal may be performed, for example, using a rapid thermal processor (RTP), heating the substrate 102 to a temperature of 750° C. to 780° C. for 10 seconds to 60 seconds.

Subsequent fabrication steps provide the structure of FIG. 1. The layer of source metal 178 is patterned to form the source electrode 146. The heavily doped base 104 may optionally be thinned before the drain electrode 140 is formed at the bottom surface 142.

Figure 3:
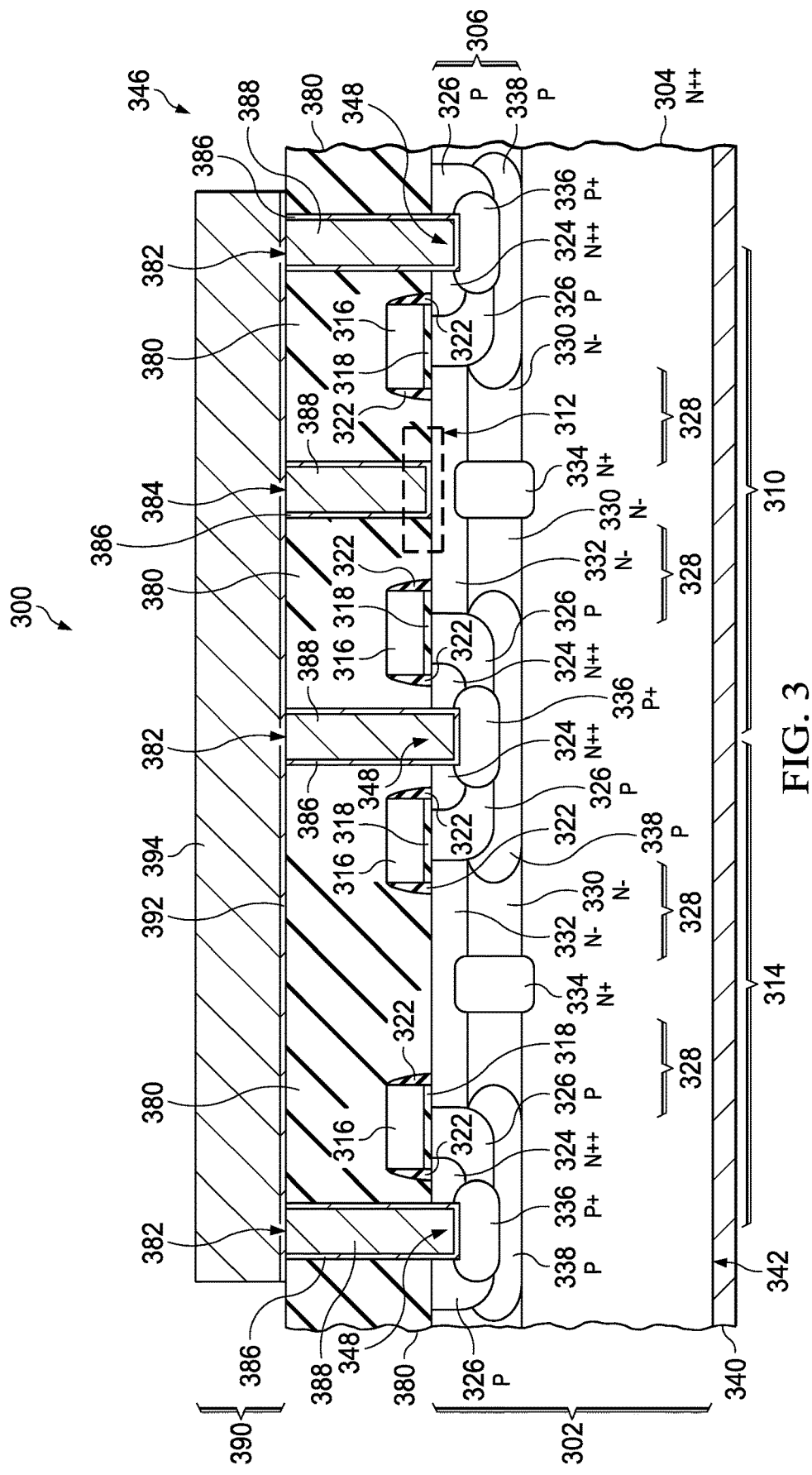
FIG. 3 is a cross section of another example semiconductor device containing an n-channel vertical power MOSFET and an integrated Schottky diode.

FIG. 3 is a cross section of another example semiconductor device containing an n-channel vertical power MOSFET and an integrated Schottky diode. The semiconductor device 300 is formed on a substrate 302 which includes an n-type heavily doped base 304 of single crystal silicon and an n-type lightly doped epitaxial layer 306 of silicon formed over the heavily doped base 304. The vertical power MOSFET 308 includes a first MOSFET cell 310 which includes the Schottky diode 312 and may optionally include a second MOSFET cell 314 which is free of a Schottky diode.

The first MOSFET cell 310 and the second MOSFET cell 314 each include portions of a planar gate 316 of the vertical power MOSFET 308 formed on a gate dielectric layer 318 at a top surface 320 of the substrate 302, for example as described in reference to FIG. 1. Spacers 322 may be formed on lateral surfaces of the planar gate 316. The first MOSFET cell 310 and the second MOSFET cell 314 also include portions of an n-type source region 324 in the substrate 302 adjacent to the planar gate 316, and portions of a p-type body region 326 under the planar gate 316 and abutting the source region 324. The first MOSFET cell 310 and the second MOSFET cell 314 also include portions of an n-type lightly doped extended drain 328. The lightly doped extended drain 328 includes an n-type lightly doped drift region 330 over the heavily doped base 304, in both the first MOSFET cell 310 and the second MOSFET cell 314. In the instant example, the lightly doped extended drain 328 in the second MOSFET cell 314 includes portions of an n-type lightly doped drain extension 332 over the lightly doped drift region 330, abutting the body region 326 under the planar gate 316; in the instant example, the first MOSFET cell 310 is free of the lightly doped drain extension 332. The first MOSFET cell 310 and the second MOSFET cell 314 further include n-type heavily doped sinkers 334 in the lightly doped drift region 330. P-type body contact regions 336 are disposed in the substrate 302 abutting the body region 326, and p-type deep wells 338 are disposed under the body region 326 and the body contact regions 336.

A pre-metal dielectric (PMD) layer 380 is disposed over the planar gate 316 and the substrate 302. The PMD layer 380 may include one or more layers of silicon dioxide, boron-phosphorus silicate glass (BPSG) and/or silicon nitride, and may be, for example, 500 nanometers to 2 microns thick. Source contacts 382 are disposed through the PMD layer 380 and make electrical connections to the source region 324 and the body contact regions 336 in contact vias 348. A Schottky contact 384 is disposed through the PMD layer 380 and makes an electrical connection to the Schottky diode 312. The source contacts 382 and the Schottky contact 384 may include, for example, a refractory metal liner 386 which contacts the source region 324, the body contact regions 336 and provides a metal side of the Schottky diode 312, and a tungsten fill metal 388 on the refractory metal liner 386.

A metal interconnect 390 is disposed on the PMD layer 380 so as to make electrical connections to the source contacts 382 and the Schottky contact 384. The metal interconnect 390 may include, for example, an adhesion layer 392 of 10 nanometers to 50 nanometers of titanium tungsten, and an aluminum layer 394 at least 1 micron thick on the adhesion layer 392. The metal interconnect 390 combined with the source contacts 382 and the Schottky contact 384 provides a source electrode 346 which makes a common connection to the source region 324, the body contact region 336 and the Schottky diode 312. Including the metal interconnect 390 in the source electrode 346 may advantageously facilitate connections to other components in the semiconductor device 300.

Figure 4A:
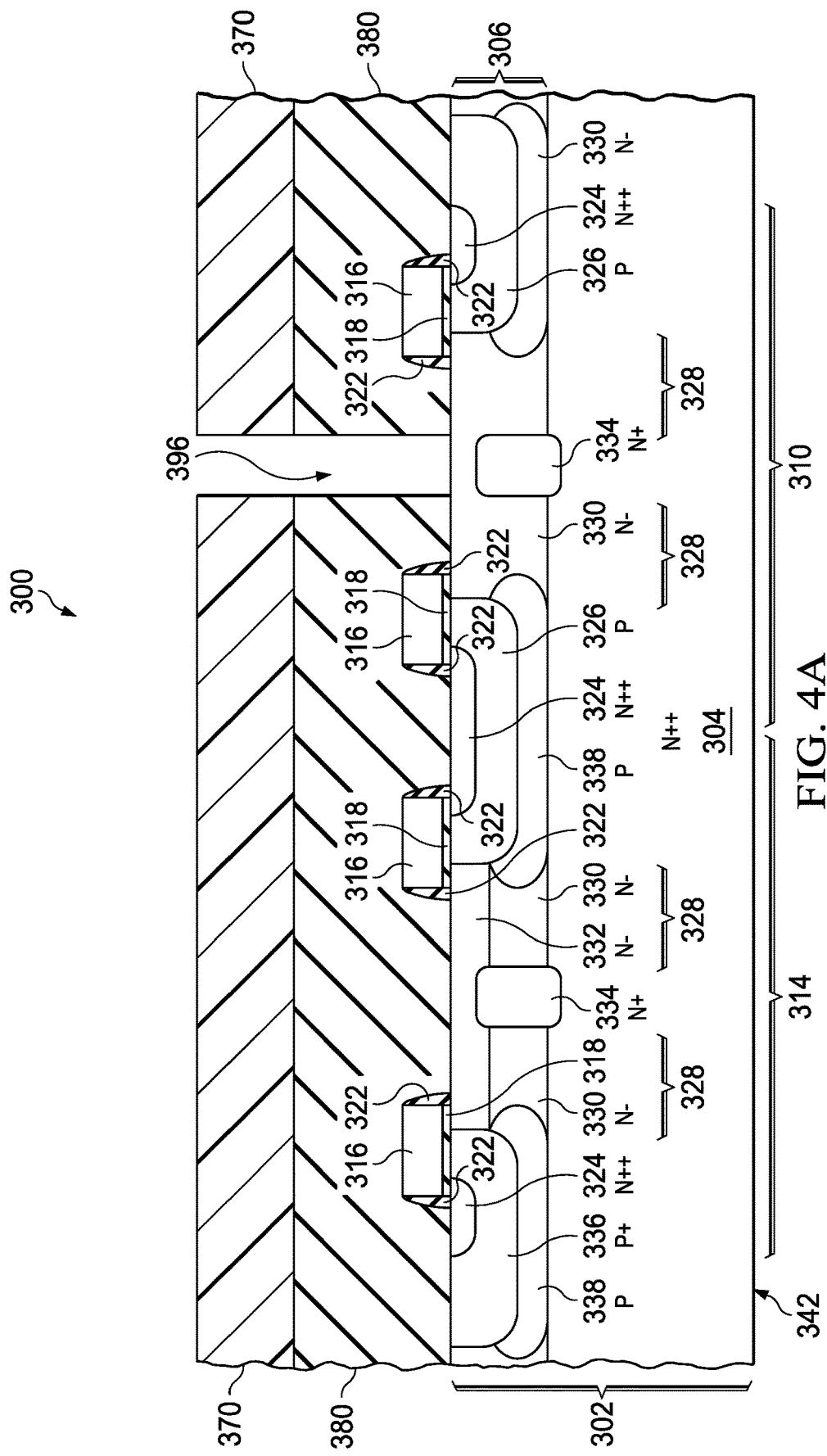
FIG. 4A through FIG. 4D are cross sections of the semiconductor device of FIG. 3, depicted at key stages of fabrication.

FIG. 4A through FIG. 4D are cross sections of the semiconductor device of FIG. 3, depicted at key stages of fabrication. Referring to FIG. 4A, a Schottky contact mask 370 is formed over the PMD layer 380 so as to expose an area for the Schottky contact 384 of FIG. 3, in the lightly doped extended drain 328 of the first MOSFET cell 310. Dielectric material is removed from the PMD layer 380 in the area exposed by the Schottky contact mask 370, down to the substrate 102, for example using an RIE process, to form a Schottky via 396. N-type dopants may optionally be implanted into the lightly doped epitaxial layer 306 in the Schottky via 396, as described in reference to FIG. 2B. The Schottky contact mask 370 is subsequently removed.

Figure 4B:
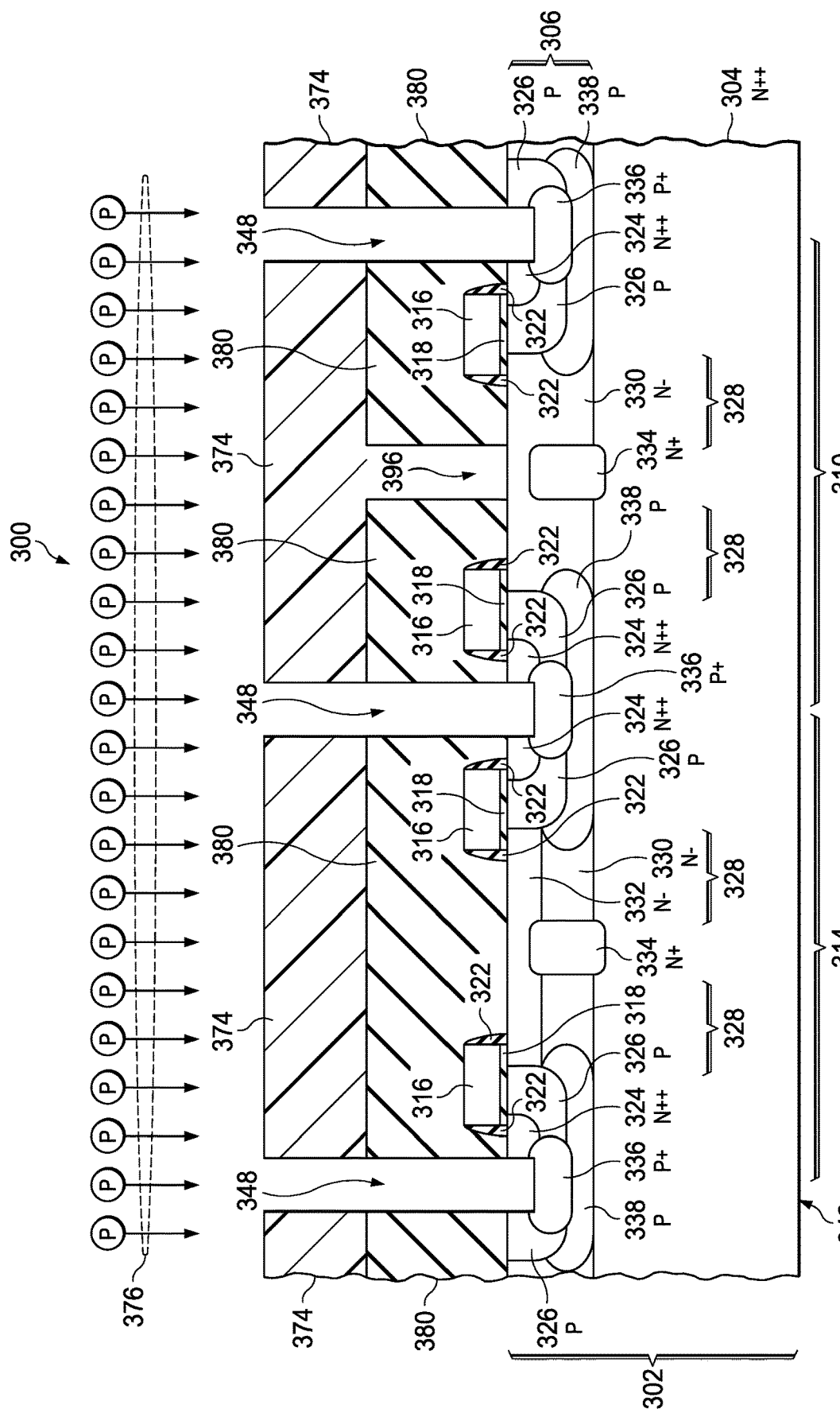

Referring to FIG. 4B, a contact mask 374 is formed over the PMD layer 380 so as to expose areas for the source contacts 382 of FIG. 3. Dielectric material is removed from the PMD layer 380 and semiconductor material is removed from the lightly doped epitaxial layer 306 in the areas exposed by the contact mask 374, for example using an RIE process, through the source region 324 and into the body region 326, to form contact vias 348.

While the contact mask 374 is in place, p-type dopants 376 such as boron are implanted into the body region 326 in the contact vias 348. The contact mask 374 is subsequently removed and the substrate 302 is annealed to diffuse and activate the implanted p-type dopants to form the body contact regions 336.

Figure 4C:
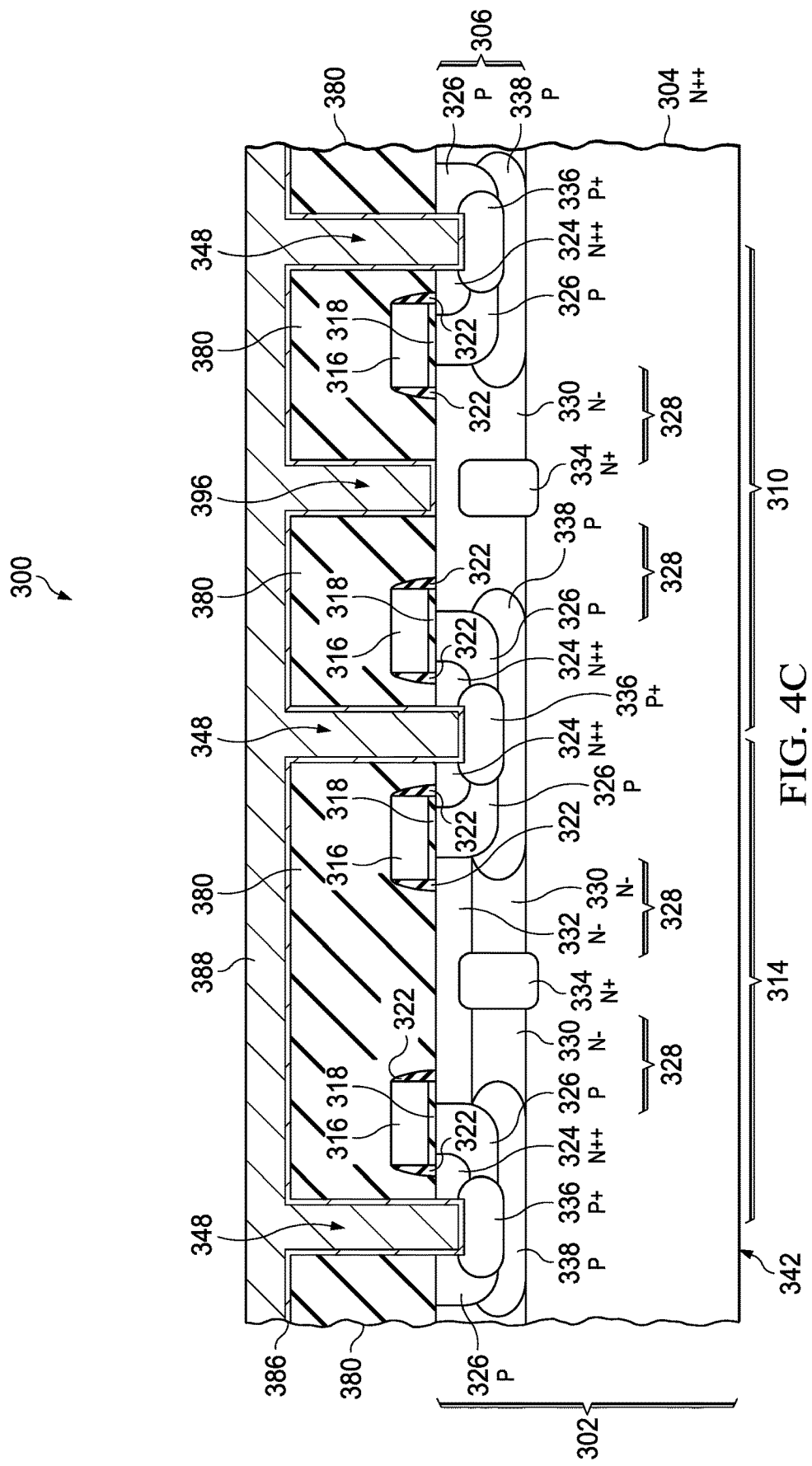

Referring to FIG. 4C, the refractory metal liner 386 is formed on the PMD layer 380, extending into the Schottky via 396 and the contact vias 348, to make electrical connections to the source region 324 and the body contact regions 336 in the contact vias 348, and provide the metal side of the Schottky diode 312. The refractory metal liner 386 may be formed using a sputter process. The tungsten fill metal 388 is formed on the refractory metal liner 386, extending into the Schottky via 396 and the contact vias 348. The tungsten fill metal 388 may be formed using a metal-organic chemical vapor deposition (MOCVD) process by reduction of tungsten hexafluoride. Optionally, a barrier layer may be formed between the refractory metal liner 386 and the tungsten fill metal 388.

Figure 4D:
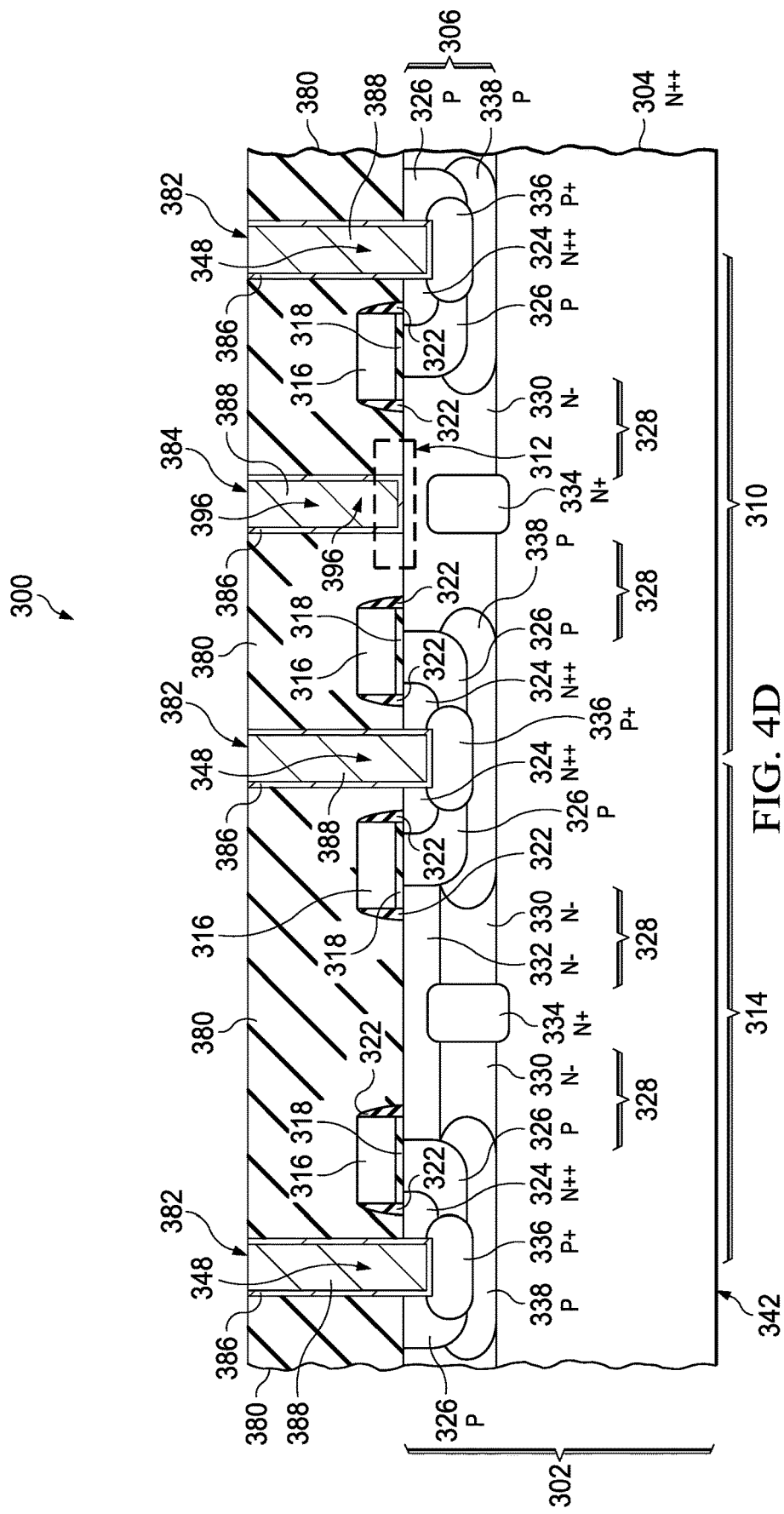

Referring to FIG. 4D, the tungsten fill metal 388 and the refractory metal liner 386 are removed from over a top surface of the PMD layer 380 to leave the source contacts 382 and the Schottky contact 384. The tungsten fill metal 388 and the refractory metal liner 386 may be removed using a chemical mechanical polish (CMP) process and/or an etchback process. Fabrication is continued by forming a metal interconnect on the source contacts 382 and the Schottky contact 384 to provide the structure of FIG. 3.

Figure 5:
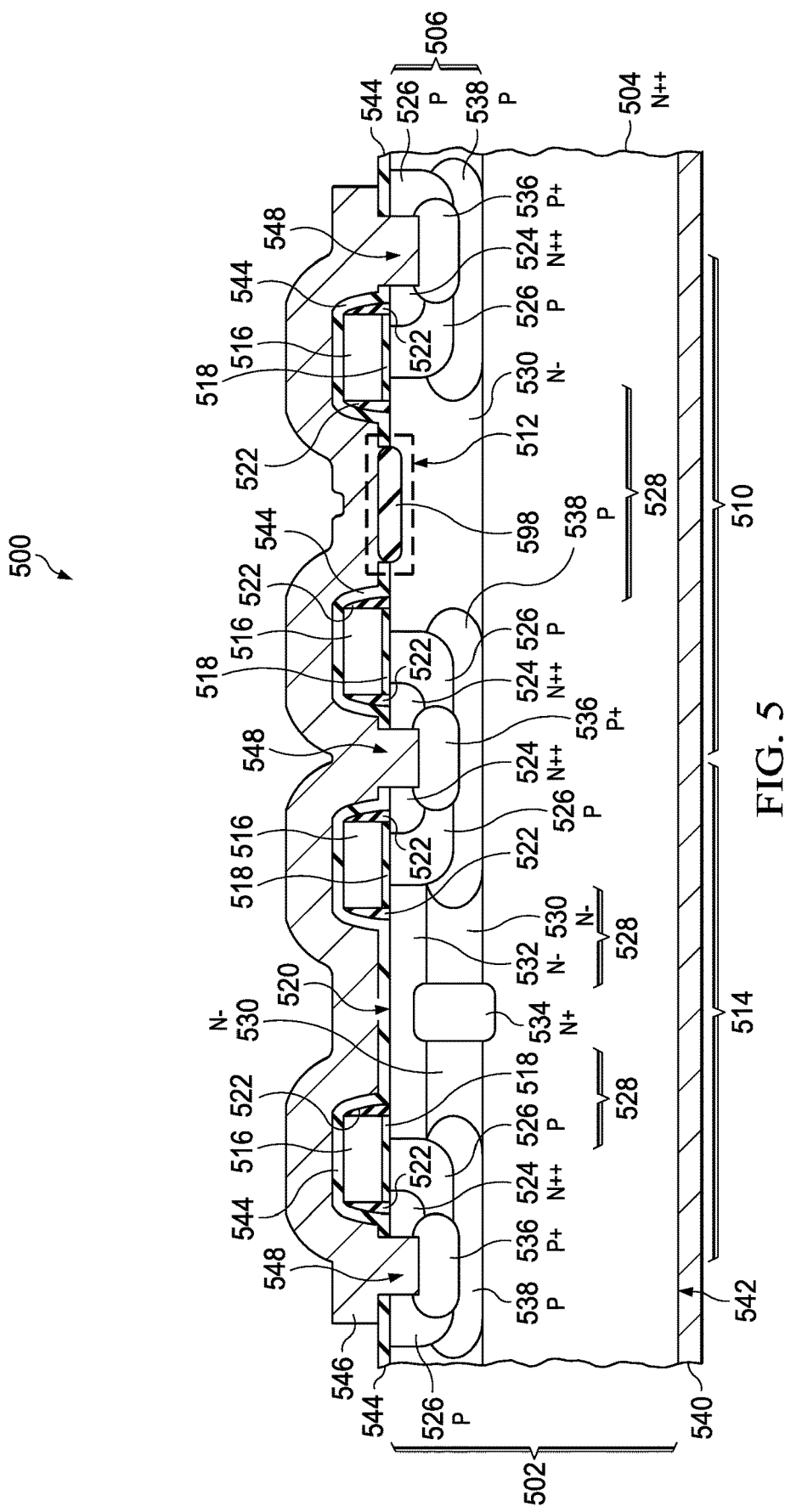
FIG. 5 is a cross section of a further example semiconductor device containing an n-channel vertical power MOSFET and an integrated Schottky diode.

FIG. 5 is a cross section of a further example semiconductor device containing an n-channel vertical power MOSFET and an integrated Schottky diode. The semiconductor device 500 is formed on a substrate 502 which includes an n-type heavily doped base 504 of single crystal silicon and an n-type lightly doped epitaxial layer 506 of silicon formed over the heavily doped base 504. The vertical power MOSFET 508 includes a first MOSFET cell 510 which includes the Schottky diode 512 and may optionally include a second MOSFET cell 514 which is free of a Schottky diode.

The first MOSFET cell 510 and the second MOSFET cell 514 each include portions of a planar gate 516 of the vertical power MOSFET 508 formed on a gate dielectric layer 518 at a top surface 520 of the substrate 502, and spacers 522 on lateral surfaces of the planar gate 516. The first MOSFET cell 510 and the second MOSFET cell 514 include portions of an n-type source region 524 in the substrate 502 adjacent to the planar gate 516, and portions of a p-type body region 526 under the planar gate 516 and abutting the source region 524. The first MOSFET cell 510 and the second MOSFET cell 514 also include portions of an n-type lightly doped extended drain 528, which includes an n-type lightly doped drift region 530 over the heavily doped base 504. The lightly doped extended drain 528 in the second MOSFET cell 514 includes portions of an n-type lightly doped drain extension 532 over the lightly doped drift region 530, abutting the body region 526 under the planar gate 516, and a n-type heavily doped sinker 534 in the lightly doped drift region 530 under the lightly doped drain extension 532; in the instant example, the first MOSFET cell 510 is free of the lightly doped drain extension 532 and the heavily doped sinker 534. P-type body contact regions 536 are disposed in the substrate 502 abutting the body region 526, and p-type deep wells 538 are disposed under the body region 526 and the body contact regions 536. The Schottky diode 512 is formed of a metal silicide layer 598 such as platinum silicide on the lightly doped drift region 530 in the first MOSFET cell 510. The metal silicide layer 598 provides an anode of the Schottky diode 512 and the lightly doped drift region 530 in contact with the metal silicide layer 598 provides a cathode of the Schottky diode 512. Forming the Schottky diode free of the lightly doped drain extension 532 and the heavily doped sinker 534 may advantageously provide desired values of barrier height and leakage current for the Schottky diode 512.

A drain electrode 540 is disposed at a bottom surface 542 of the heavily doped base 504. A dielectric layer 544 is disposed over the planar gate 516 and the substrate 502. A source electrode 546 is disposed over the dielectric layer 544 and makes contact to the source region 524 and the body contact regions 536 in contact vias 548. The source electrode 546 also makes contact with the metal layer 598 of the Schottky diode 512 in the first MOSFET cell 510 through an opening in the dielectric layer 544. The Schottky diode 512 is connected to the drain electrode 540 through the heavily doped base 504. The source electrode 546 may include an adhesion layer such as titanium or titanium tungsten, which makes contact with the source region 524, the body contact regions 536 and the Schottky diode 512. The source electrode 546 includes a thick electrode layer, such as aluminum, at least 1 micron thick, formed on the adhesion layer.

Figure 6:
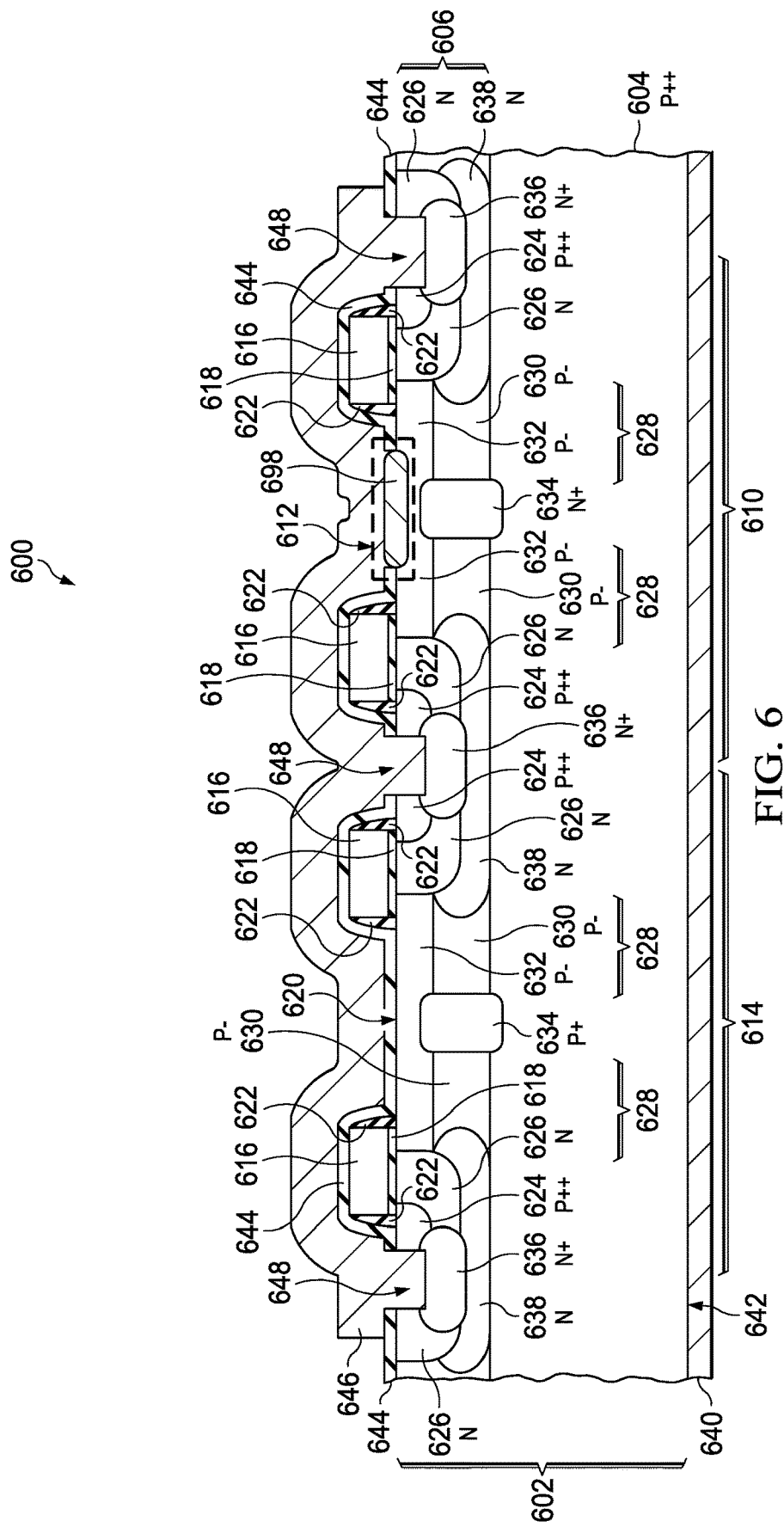
FIG. 6 is a cross section of an alternate example semiconductor device containing a p-channel vertical power MOSFET and an integrated Schottky diode.

FIG. 6 is a cross section of an alternate example semiconductor device containing a p-channel vertical power MOSFET and an integrated Schottky diode. The semiconductor device 600 is formed on a substrate 602 which includes a p-type heavily doped base 604 of single crystal silicon and a p-type lightly doped epitaxial layer 606 of silicon formed over the heavily doped base 604. The heavily doped base 604 has a bulk resistivity of less than 0.1 ohm-cm. The lightly doped epitaxial layer 606 has an average doping density of $1\times10^{15}$ cm$^{-3}$ to $1\times10^{16}$ cm$^{-3}$. The vertical power MOSFET 608 includes a first MOSFET cell 610 which includes the Schottky diode 612 and may optionally include a second MOSFET cell 614 which is free of a Schottky diode.

The first MOSFET cell 610 and the second MOSFET cell 614 each include portions of a planar gate 616 of the vertical power MOSFET 608 formed on a gate dielectric layer 618 at a top surface 620 of the substrate 602, and spacers 622 on lateral surfaces of the planar gate 616. The first MOSFET cell 610 and the second MOSFET cell 614 include portions of a p-type source region 624 in the substrate 602 adjacent to the planar gate 616, and portions of an n-type body region 626 under the planar gate 616 and abutting the source region 624. The first MOSFET cell 610 and the second MOSFET cell 614 also include portions of a p-type lightly doped extended drain 628, which includes a p-type lightly doped drift region 630 over the heavily doped base 604. The lightly doped extended drain 628 in the first MOSFET cell 610 and the second MOSFET cell 614 includes portions of a p-type lightly doped drain extension 632 over the lightly doped drift region 630, abutting the body region 626 under the planar gate 616, and p-type heavily doped sinkers 634 in the lightly doped drift region 630 under the lightly doped drain extension 632. N-type body contact regions 636 are disposed in the substrate 602 abutting the body region 626, and n-type deep wells 638 are disposed under the body region 626 and the body contact regions 636. The Schottky diode 612 is formed of a metal silicide layer 698 such as molybdenum silicide on the lightly doped drain extension 632 in the first MOSFET cell 610. The metal silicide layer 698 provides a cathode of the Schottky diode 612 and the lightly doped drain extension 632 in contact with the metal silicide layer 698 provides an anode of the Schottky diode 612.

A drain electrode 640 is disposed at a bottom surface 642 of the heavily doped base 604. A dielectric layer 644 is disposed over the planar gate 616 and the substrate 602. A source electrode 646 is disposed over the dielectric layer 644 and makes contact to the source region 624 and the body contact regions 636 in contact vias 648. The source electrode 646 also makes contact with the metal silicide layer 698 of the Schottky diode 612 in the first MOSFET cell 610 through an opening in the dielectric layer 644. The Schottky diode 612 is connected to the drain electrode 640 through the heavily doped sinker 634 under the Schottky diode 612 and the heavily doped base 604. The source electrode 646 may include an adhesion layer such as titanium or titanium tungsten, which makes contact with the source region 624, the body contact regions 636 and the Schottky diode 612. The source electrode 646 includes a thick electrode layer, such as aluminum, at least 1 micron thick, formed on the adhesion layer.

FIG. 7 is a top view of an example semiconductor device containing a vertical power MOSFET and an integrated Schottky diode. The semiconductor device 700, which may be formed according to any of the examples described above, includes a vertical power MOSFET 708. The vertical power MOSFET 708 includes a plurality of first MOSFET cells 710 which include Schottky diodes 712, and a plurality of second MOSFET cells 714 which are free of Schottky diodes. The vertical power MOSFET 708 has a planar gate 716 which extends through each of the first MOSFET cells 710 and the second MOSFET cells 714. A number of the first MOSFET cells 710 and a number of the second MOSFET cells 714 may be selected to provide desired values of current capacity and maximum operating frequency for the vertical power MOSFET 708. For example, the number of the first MOSFET cells 710 may be 5 percent to 15 percent of the total number of first MOSFET cells 710 and second MOSFET cells 714. Other configurations of the vertical power MOSFET 708 containing a plurality of the first MOSFET cells 710 and a plurality of the second MOSFET cells 714 are within the scope of the instant example.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
    a substrate, comprising:
        a base comprising silicon, having a first conductivity type, with a bulk resistivity less than 0.1 ohm-cm; and
        an epitaxial layer comprising silicon, having the first conductivity type, disposed over the base; and
    a vertical power metal oxide semiconductor field effect transistor (MOSFET), comprising:
        a planar gate disposed over a gate dielectric layer over a top, horizontal, surface of the epitaxial layer;
        a drain electrode disposed on a bottom surface of the base;
        an extended drain, having the first conductivity type, disposed in the epitaxial layer adjacent to and extending under the planar gate, the extended drain including a drift region;
        a source electrode comprising metal disposed over the planar gate and the epitaxial layer, the source electrode coupled to a source region on a first side of the planar gate; and
        a first MOSFET cell which includes a portion of the planar gate, a portion of the source region, and a portion of the extended drain, the first MOSFET cell comprising an integrated Schottky diode provided by the metal of the source electrode in contact with the extended drain on a second side of the planar gate opposite the source region, the Schottky diode being coupled to the drain electrode through the extended drain and the base.

2. The semiconductor device of claim 1, wherein the vertical power MOSFET comprises a second MOSFET cell which includes a portion of the planar gate, a portion of the source region, and a portion of the extended drain, the second MOSFET cell being free of a Schottky diode.

3. The semiconductor device of claim 1, wherein the extended drain in the first MOSFET cell includes a drain extension, having the first conductivity type, disposed over the drift region, so that the Schottky diode is formed at an interface between the metal of source electrode and the drain extension.

4. The semiconductor device of claim 1, wherein the first MOSFET cell includes a sinker, having the first conductivity type, under the Schottky diode, extending to the base, an average doping density of the sinker being $10^{18}$ cm$^{-3}$ to $10^{20}$ cm$^{-3}$.

5. The semiconductor device of claim 1, wherein the source electrode includes a conformal metal layer over the planar gate and the substrate.

6. The semiconductor device of claim 1, wherein the source electrode includes a metal interconnect disposed over, and making electrical contact to, a plurality of source contacts and a Schottky contact, the Schottky contact providing the metal of the source electrode for the Schottky diode, and the source contacts making electrical connections to the source region.

7. The semiconductor device of claim 1, wherein the source electrode includes a metal in contact with the extended drain at the Schottky diode, the metal being selected from the group consisting of: molybdenum, palladium, titanium, platinum, cobalt, chromium and nickel.

8. The semiconductor device of claim 1, wherein the first conductivity type is n-type and the vertical power MOSFET is an n-channel vertical power MOSFET.

9. The semiconductor device of claim 1, wherein:
the vertical power MOSFET comprises a plurality of the first MOSFET cells; and
the vertical power MOSFET comprises a plurality of second MOSFET cells, each second MOSFET cell including a portion of the planar gate, a portion of the source region, and a portion of the extended drain, each second MOSFET cell being free of a Schottky diode.

10. A semiconductor device, comprising:
a substrate having:
a base comprising silicon having a first conductivity type, with a bulk resistivity less than 0.1 ohm-cm; and
an epitaxial layer disposed over the base, the epitaxial layer comprising silicon, having the first conductivity type;
a gate dielectric layer of a vertical power MOSFET at a top surface of the epitaxial layer partially overlapping a drift region and a lightly-doped drain extension each having the first conductivity type, wherein the lightly-doped drain extension is in direct contact with the drift region and the drift region is in direct contact with the base;
a planar gate of the vertical power MOSFET over the gate dielectric layer, wherein a first MOSFET cell includes at least a portion of the planar gate;
a body region of the vertical power MOSFET in the epitaxial layer, the body region extending under the planar gate, the body region having a second, opposite, conductivity type;
a source electrode over the planar gate and the substrate so as to make electrical contact to a source region of the vertical power MOSFET on a first side of the planar gate and to contact the lightly-doped drain extension on a second side of the planar gate opposite the source region to form a Schottky diode in the first MOSFET cell; and
a drain electrode at a bottom surface of the base.

11. The semiconductor device of claim 10, wherein the vertical power MOSFET comprises a second MOSFET cell which includes a portion of the planar gate, a portion of the source region, and a portion of the lightly-doped drain extension, the second MOSFET cell being free of a Schottky diode.

12. The semiconductor device of claim 10, further comprising a sinker, the sinker having the first conductivity type with an average doping density of $10^{18}$ cm$^{-3}$ to $10^{20}$ cm$^{-3}$, under the Schottky diode, extending to the base, wherein a portion of the lightly-doped drain extension overlies the sinker.

13. The semiconductor device of claim 10, wherein the source electrode comprises a conformal layer of metal over the planar gate and the substrate.

14. The semiconductor device of claim 10, further comprising:
a pre-metal dielectric (PMD) layer over the planar gate and the substrate;
a Schottky contact through the PMD layer on the Schottky diode;
a plurality of source contacts through the PMD layer so as to make electrical contact with the source region; and
a metal interconnect over the PMD layer so as to make electrical connections to the Schottky contact and the source contacts.

15. The semiconductor device of claim 10, wherein the source electrode comprises a layer of metal in contact with the lightly-doped drain extension at the Schottky diode, the metal being selected from the group consisting of: molybdenum, palladium, titanium, platinum, cobalt, chromium and nickel.

16. The semiconductor device of claim 10, wherein the first conductivity type is n-type and the vertical power MOSFET is an n-channel vertical power MOSFET.

17. The semiconductor device of claim 10, wherein:
the vertical power MOSFET comprises a plurality of the first MOSFET cells; and
the vertical power MOSFET comprises a plurality of second MOSFET cells, each the second MOSFET cell including a portion of the planar gate, a portion of the source region, and a portion of the lightly-doped drain extension, each the second MOSFET cell being free of a Schottky diode.

18. A semiconductor device, comprising:
an epitaxial layer over a base, the base comprising silicon having a first conductivity type and the epitaxial layer comprising silicon having the first conductivity type;
a gate dielectric layer of a vertical power MOSFET at a top surface of the epitaxial layer partially overlapping a lightly-doped drain extension region, the lightly-doped drain extension region having the first conductivity type in the epitaxial layer, the epitaxial layer including a drift region underlying the lightly-doped drain extension region, wherein the drift region is in direct contact with the base and the lightly-doped drain extension is in direct contact with the drift region;
a gate of the vertical power MOSFET over the gate dielectric layer;
a body region of the vertical power MOSFET in the epitaxial layer, the body region extending under the gate, the body region having a second, opposite, conductivity type;

a source electrode over the gate and the epitaxial layer so as to make electrical contact to a source region of the vertical power MOSFET on a first side of the gate and to contact the lightly-doped drain extension region on a second side of the gate opposite the source region to form a Schottky diode; and a drain electrode at a bottom surface of the base.

19. The semiconductor device of claim 18, further comprising a sinker, the sinker having the first conductivity type, the sinker being heavily doped with respect to the lightly-doped drain extension region, and the sinker being located under the Schottky diode and extending to the base, wherein a portion of the lightly-doped drain extension overlies the sinker.

20. The semiconductor device of claim 18, wherein the source electrode comprises a layer of metal in contact with the lightly-doped drain extension region at the Schottky diode, the metal being selected from the group consisting of: molybdenum, palladium, titanium, platinum, cobalt, chromium and nickel.

* * * * *